United States Patent
Zheng et al.

(10) Patent No.: US 6,806,204 B1
(45) Date of Patent: Oct. 19, 2004

(54) SEMICONDUCTOR ETCH SPEED MODIFICATION

(75) Inventors: Jun-Fei Zheng, Palo Alto, CA (US); Jesper Hanberg, Soborg (DK)

(73) Assignee: Intel Corporation, Santa Clara, CA (US)

(*) Notice: Subject to any disclaimer, the term of this patent is extended or adjusted under 35 U.S.C. 154(b) by 11 days.

(21) Appl. No.: 10/611,837

(22) Filed: Jun. 30, 2003

(51) Int. Cl.[7] .................. H01L 21/302; H01L 21/461
(52) U.S. Cl. ................. 438/738; 438/735; 438/705; 438/714
(58) Field of Search ................... 438/604–606, 438/705, 707, 710, 714, 735–739, 745, 750–752

(56) References Cited

U.S. PATENT DOCUMENTS

| | | | |
|---|---|---|---|
| 5,001,076 A | | 3/1991 | Mikkelson |
| 5,121,174 A | | 6/1992 | Forgerson, II et al. |
| 5,144,410 A | | 9/1992 | Johnson |
| 6,007,733 A | * | 12/1999 | Jang et al. .................. 216/80 |
| 6,232,162 B1 | * | 5/2001 | Kao .......................... 438/199 |
| 6,489,251 B2 | * | 12/2002 | Chang ........................ 438/745 |
| 6,642,071 B2 | * | 11/2003 | Cheng ......................... 438/22 |
| 2003/0230234 A1 | * | 12/2003 | Nam et al. .................. 117/97 |

FOREIGN PATENT DOCUMENTS

JP        02000164732 A  *  6/2000

OTHER PUBLICATIONS

Alavi, Kamal, Ogut, S., Lyman, P., Hoke, W., and Borokowski, M., A Highly Uniform, and High Throughput, Double Selective pHEMT Process Using and All West Etch Chemistry, GaAsMANTECH Conference, 2002.

* cited by examiner

*Primary Examiner*—Amir Zarabian
*Assistant Examiner*—Khanh Duong

(57) ABSTRACT

In accordance with embodiments of the methods of the present invention, a sacrificial layer provides an etch speed modification to effectively etch multiple semiconductor devices having dissimilar materials to a common layer or substrate with a common etch process. The time to etch remove a second exposed portion is compared with the time to etch remove a first exposed portion, and a sacrificial layer is deposited on the first exposed portion having a time to etch remove substantially equal to the difference. The sacrificial layer is provided to have predetermined material composition, material property and layer thickness, among other things, to provide a desired time to etch remove. The methods also provide for self-aligned via formation providing highly defined vias by the etch removal of sacrificial material rather than direct etching of the vie. The methods also provide planarization between two or more devices.

29 Claims, 14 Drawing Sheets

SEMICONDUCTOR ETCH SPEED MODIFICATION

FIELD OF THE INVENTION

The present invention relates to integrated semiconductor component fabrication and, more particularly, to process etch control for multiple semiconductor devices comprising dissimilar material configurations on a common substrate.

BACKGROUND OF INVENTION

Semiconductor components, such as those associated with electronic and optoelectronic applications, frequently comprise layered heterostructures of semiconductor materials. The semiconductor devices that form the components are commonly fabricated in a layer upon layer process in the vertical direction upon a common layer or substrate. The layers are selectively deposited and portions removed defining semiconductor devices using deposition and material removing processes. These layers can be on the order of nanometers in thickness. The methods are used to create devices, such as diodes and transistors.

An integrated semiconductor component may consist of a plurality of semiconductor devices of various material compositions and thickness interconnected on a common layer or substrate. Integrated semiconductor components have been enabling multi-function capability, such as, but not limited to, laser, modulator, and detector devices, to be integrated onto a common substrate. Integrated semiconductor fabrication processes can be very complex. For example, planar monolithic integration commonly requires that a plurality of epitaxial (epi)—deposited devices of dissimilar composition and dimension extend from a common planar layer, such as a bottom n+ contact layer.

However, devices are formed from device layers having dissimilar composition and dimension, and therefore different overall etch rates. These different etch rates preclude the use of one etch process to simultaneously etch all unnecessary portions of the device layer to the common layer. Because of these differential etch rates, complex processing, such as sequential etch for each device type, is employed. Such processing is costly and low yielding.

FIGS. 20A, 20B, and 20C are cross-sectional views of an example of a result of using one etch process to form multiple dissimilar devices. FIG. 20A is a cross-sectional view of a first device layer 19 and an adjacent second device layer 29 extending from a common layer 9, prior to etching. The elevation of a first device surface 51 is substantially coplanar with that of a second device surface 52, to ultimately produce two devices having substantially co-planar surfaces required for a particular purpose. The co-planar relationship between the devices may not be required in other embodiments, and is not limited thereto. First and second etch masks 39a,39b are formed upon the first and second device layer surfaces 51,52, respectively, defining exposed portions 93 that are to be removed from the common layer 9 by the etch process. The first device layer 19 has a higher etch rate than the second device layer 29.

FIG. 20B is a cross-sectional view of the result during the selected etch process. The exposed portion 93 of the first device layer 19 has been substantially removed from the common layer 9. The exposed portion of the second device layer 29 is in the process of being removed forming a partially etched second device layer 59.

FIG. 20C is a cross-sectional view of the result at the completion of the etch process, wherein substantially all of the exposed partially etched second device layer 59 has been removed from the common layer 9. The exposed common layer 9 adjacent the first device 49 is now etched through to an under-layer 91 as well. The discontinuity of the common layer 9 between the first device 49 and second device 79 results in a defective product.

In the course of fabrication, some processing steps leave an exposed device side wall 39a,39b. These side walls form conductive oxide layers in some material configurations, such as, but not limited to, InP- and InGaAsP-containing configurations. The side wall 39a,39b is, therefore, subsequently passivated so that no leakage current will exist between individual material layers forming the device 49,79, and/or between the layer above to the layer below 91 the device. Commonly, passivation is achieved by the application of an encasing passivation layer, such as, but not limited to, BCB polymer and PMMA photoresist, that is spun around and over the device to encapsulate the side wall 39a,39b.

Another issue in the fabrication of integrated semiconductor components is providing interlayer interconnection. One approach in larger-scale component fabrication is the use of vias; a cylindrical bore-like feature extending through a dielectric layer from one layer to another, that can be provided with electrically conductive material to effect an interconnection with devices on various layers. Vias for larger-scale components are commonly formed using mechanical drilling. Etch processing of the vias for nanometer-scale devices is problematic, including, but not limited to, adding additional steps to the fabrication process and being sensitive to etch solution variations.

New methods are needed for the fabrication of integrated semiconductor components that provide etch speed modification to effectively etch multiple dissimilar materials to a common layer or substrate with a common etch process, self-aligned via formation, and/or planarization-between two or more devices. The methods would preferably provide a process that is less complex, more forgiving, have a low defect rate, impart little to no harm to the underlying desired material layers, and/or are reasonably economical.

DESCRIPTION

Figure 1:
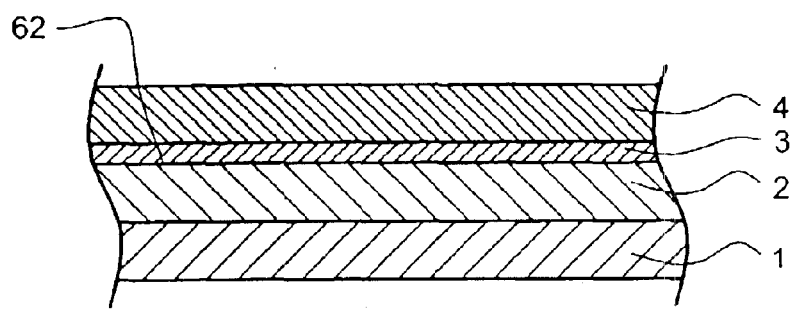
FIG. 1 is a cross-sectional view of a substrate, a conformal device layer, an etch stop layer, and a conformal hard mask layer, in accordance with an embodiment of the method of the present invention.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

The following embodiments, in accordance with the methods of the present invention, are described as applied to the fabrication of compound devices. This is but one example of a class of devices that can benefit from the present invention. The present invention is suitable for a wide variety of material processing, including, but not limited to, Indium Phosphide and other compound semiconductor-based materials, and silicon, and is not to be limited by the included examples. The present invention is also useful where quasi-planarization between a plurality of devices of dissimilar material and geometrical configuration on a common layer or substrate is required.

In the following description, the term "device" is used to identify the discrete layer or layers of material that forms the active semiconductor devices or elements, also known as semiconductor devices, and compound semiconductor devices. A device, individually and in combination, can form many configurations, such as, but not limited to, diode, transistor, and FET, including devices found in electronic and optoelectronic devices. The embodiments of the present invention may be practiced for many applications, such as, but not limited to, etch speed modification to effectively substantially simultaneously etch multiple dissimilar materials to a common layer or substrate with a common etch process, self-aligned via formation, and/or planarization between two or more devices, and therefore, the present invention is not to be limited to the devices and/or materials described by way of example.

Compound semiconductor-based devices are used in a wide variety of electronic and photoelectronic (photonic) systems. Various elements are combined to become compound semiconductors. The most common elemental combinations come from the Group III and Group V elements, although II–VIs and some from the Group IVs are also considered. These combinations include Gallium (Ga) and Arsenic (As) to form Gallium Arsenide (GaAs), Indium (In) and Phosphorus (P) to form Indium Phosphide (InP), Silicon (Si) and Carbon (C) to form Silicon Carbide (SiC), and Gallium and Nitrogen to form Gallium Nitride (GaN). Often, more than two elements are combined, such as with Aluminum (Al) to form alloys including AlGaP and AlGaN, as well as InGaAsP and InGaAsN.

Compound semiconductor-based devices are fabricated or grown from a common layer or substrate. A substrate comprises material, including, but not limited to, silicon or compound semiconductor-based material, formed or sliced into what is known as a wafer. The wafer is commonly sliced and polished to form the thin starting substrate upon which the electronic or photonic devices are fabricated. The devices may be fabricated directly from the substrate, or from one or more layers of material deposited onto the substrate.

FIGS. 1 through 17 illustrate side cross-sectional views of the result at various stages of the fabrication of an integrated semiconductor component comprising multiple devices in accordance with embodiments of the methods of the present invention. The fabrication techniques are shown by way of example and are not limited thereto, as other technologies may be used to fabricate the devices with similar features and characteristics. The figures illustrate idealized structures having straight sides and sharp corners. It is understood and appreciated, that the resulting structures formed by embodiments of methods of the present invention may deviate from the idealized illustrations shown in the figures in ways, such as, but not limited to, non-straight sides and rounded corners, without substantially effecting the intended result.

FIGS. 1 through 17 illustrate two devices shown by way of example to particularly point out the elements of the present invention. It is understood that more than two devices, and more probably hundreds of thousands of devices, may be fabricated on the substrate using the methods of the invention. It is also understood that the plurality of devices can be of any size, shape, and material composition, among others, and not limited to those shown or described herein. The devices are shown provided on a single common layer, which can be any one of which, and not limited to, a substrate and a common material layer that itself is on a substrate or other material layers.

In accordance with embodiments of the methods of the present invention, methods are provided that use a sacrificial layer on a first semiconductor layer having a faster etch removal time as compared with a second semiconductor layer. The sacrificial layer provides etch removal speed reduction for the first semiconductor layer to ensure etch removal substantially simultaneously to a common layer with the one or more second semiconductor layers. The sacrificial layer composition and/or thickness is predetermined to provide the desired etch removal time in combination with the first semiconductor layer.

FIG. 1 is a cross-sectional view of a common layer 1, a first semiconductor layer 2, an etch stop layer 3, and a sacrificial layer 4. The first semiconductor layer 2 comprises semiconductor material from which a desired first device will be formed. The first semiconductor layer 2 may be a single layer of one material, such as, but not limited to, InP, or comprise the multiple material layers of a compound device, such as, but not limited to, InP/InGaAsP multi-quantum wells/InP.

The etch stop layer 3 comprises a predetermined material that is resistant to a predetermined etch process. The etch stop layer 3 is provided to stop or prevent additional etch removal, a process known in the art. For example, wherein a layer of GaAs can be etched with $H_2O$—$H_2O_2$—$NH_4OH$, the etch removal will stop when it encounters a layer of AlAs. Etch stop layers 3 comprising AlGaAs, AlAs, and InGaP, among others, are known in the art.

The etch stop layer 3 is provided to prevent the etching of the device as the sacrificial layer 4 is etch removed. In other embodiments in accordance with the methods of the present invention, an etch stop layer 3 is not provided, such as, but not limited to, when the device layer 2 comprises a material resistant to the etchant used to etch the sacrificial layer 4. As will be discussed below, it is desired that the first device formed from the first semiconductor layer 2 be subjected to little or no etch removal.

The sacrificial layer 4 comprises a material that is complimentary to the material to be subsequently etched, on an adjacent device layer. The significance of the sacrificial layer 4 on the etch process is discussed below.

Figure 2:
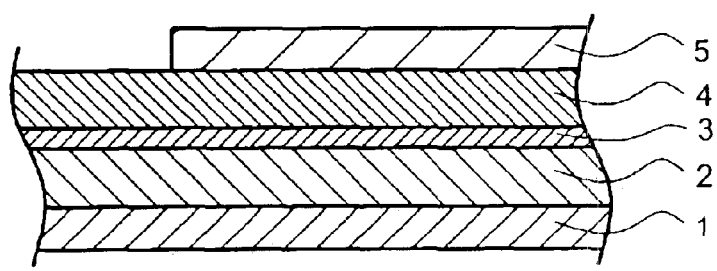
FIG. 2 is a cross-sectional view of a mask formed upon the hard mask layer, in accordance with an embodiment of the method of the present invention.

FIG. 2 is a cross-sectional view of a mask 5 formed upon the sacrificial layer 4 of the embodiment of FIG. 1. The method in which the mask 5 is formed is well known using methods, such as, but not limited to, photolithographic techniques.

Figure 3:
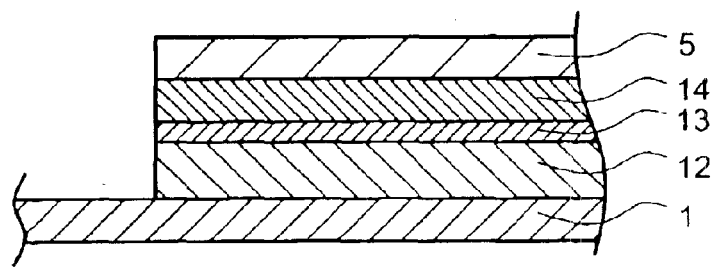
FIG. 3 is a cross-sectional view showing the mask, the hard mask layer, the etch stop layer, and the device layer and an exposed substrate portion after an etch process, in accordance with an embodiment of the method of the present invention.

FIG. 3 is a cross-sectional view showing the common layer 1 after an appropriate etch process of the embodiment of FIG. 2. The mask 5 is used to form a patterned sacrificial layer 14, a patterned etch stop layer 13, and a patterned first semiconductor layer 12. The etch process removes the exposed portions that are not protected by the mask 5 to expose a corresponding portion of the underlying common layer 1.

Figure 4:
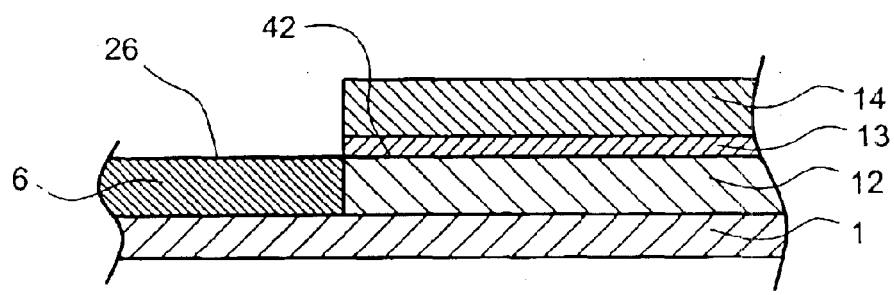
FIG. 4 is a cross-sectional view showing the hard mask layer after an etch process that removes the mask and the deposition of a second device layer on the exposed substrate, in accordance with an embodiment of the method of the present invention.

FIG. 4 is a cross-sectional view showing the common layer 1 after an appropriate etch process is used to remove the mask and after the deposition of a second semiconductor layer 6 on the exposed portion of the common layer 1 of the embodiment of FIG. 3. The second semiconductor layer 6 is deposited onto the exposed common layer 1 using methods, such as, but not limited to, epitaxial methods used in accordance with this embodiment. Other deposition methods known in the art are also anticipated. The elevation of the second semiconductor layer surface 26 of the second semiconductor layer 6 is predetermined to be substantially coincident with the elevation of the patterned first semiconductor layer surface 42 of the patterned first semiconductor layer 12, in this embodiment, shown by way of example and not limited thereto.

Figure 5:
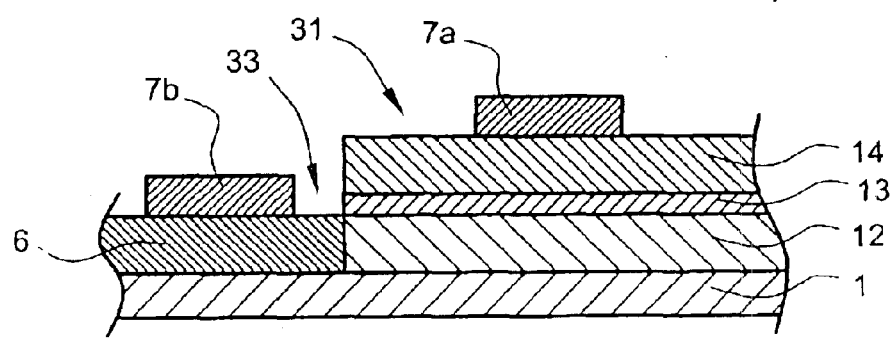
FIG. 5 is a cross-sectional view showing the hard mask after a process used to define the hard mask and a defined device layer, in accordance with an embodiment of the method of the present invention.

FIG. 5 is a cross-sectional view of first and second hard masks 7a,7b on the embodiment of FIG. 4. The first hard mask 7a is formed upon the patterned sacrificial layer 14, and the second hard mask 7b is formed upon the second semiconductor layer 6. The first and second hard masks 7a,7b, formed in a common process, comprise a material that has predetermined etch characteristics that is resistant to the etch chemistry selected to etch adjacent exposed layers. The first and second hard masks 7a,7b comprise a material, such as, but not limited to, silicon dioxide (SiO2), silicon nitride (Si3N4), and metals. The method in which the first and second hard masks 7a,7b are formed is well known using methods, such as, but not limited to, photolithographic mask and etch techniques.

The first hard mask 7a defines a predetermined device-sized portion of an underlying layer or layers, wherein in this embodiment, the underlying layers comprise the patterned sacrificial layer 14 and the layers thereunder. A first exposed portion 31 is defined as the exposed portions of the patterned sacrificial layer 24, the patterned etch stop layer 13, and the patterned first semiconductor layer 12 that is not directly under the first hard mask 7a.

The second hard mask 7b is used to define a predetermined device-sized portion of the second semiconductor layer 6 and the second exposed portion 33 of, the second semiconductor layer 6 that is not directly under the second hard mask 7b.

It is during the etch process to remove the first and second exposed portions 31,33 from the common layer 1 wherein the time to etch remove the first exposed portion 31 from the common layer is to be substantially the same as the time to etch remove the second exposed portion 33 from the common layer. The time to etch remove the second exposed portion 33 is predetermined by, such as, but not limited to, analytical analysis, experimental analysis, pre-existing etch rate data, and/or newly derived etch rate data. This analysis considers, among other things, the material composition, material properties and layer thickness of the second exposed portion 33, as well as the composition of the etch chemistry and process used. For example and illustration purposes, the time to etch remove the second exposed portion 33 is the ratio of the thickness of the second semiconductor layer 6 and an etch rate on the scale of 0.1 $\mu$m/min.

The time to etch remove the second exposed portion 33 is compared with a similar determination of time to etch remove for the first exposed portion 31 of the patterned etch stop layer 13 (if any) and the patterned first semiconductor layer 12; the combined time to etch remove each is assumed, for sake of illustration, less than the second exposed portion 33. To compensate for the differential in the time of etch removal and to provide that the time to etch remove both to or within a common layer 1 are substantially the same for the first and second exposed portions 31,33, the sacrificial layer 4 is deposited on the etch stop layer 3, as shown in FIG. 1. The sacrificial layer 4 is provided to have, but not limited to, predetermined material composition, material properties and/or layer thickness, among other properties and parameters, to provide a time of etch removal that is substantially equal to the differential in the time of the first exposed portion etch removal. The sacrificial layer 24, therefore, provides a protracted etch rate mechanism, to provide timing control for etch removal substantially simultaneously to a common layer.

The etch rate, and corresponding time to etch remove, of the sacrificial layer 4 is predetermined by, such as, but not limited to, analytical analysis, experimental analysis, pre-existing etch rate data, and/or newly derived etch rate data. This analysis considers, among other things, the material composition, material properties and layer thickness of the first exposed portion 31, as well as the composition of the etch chemistry and process to be used. The sacrificial layer 4 comprises a material or materials, such as, but not limited to, semiconductor materials. In one embodiment in accordance with the present invention, the sacrificial layer 4 comprises the same material as the second semiconductor layer 6.

For illustrative purposes, the thickness of the sacrificial layer 4 required to provide a substantially zero etch time differential is determined by predetermining a first predetermined etch removal time by calculating a ratio of a thickness of the first device layer thickness and a first device layer etch rate, and predetermining the second predetermined etch removal time by calculating a ratio of a second device layer thickness and a second device layer etch rate; and wherein forming a sacrificial layer onto the first device layer comprises determining a sacrificial layer thickness as the product of an etch removal time differential and a sacrificial layer etch rate, and forming the sacrificial layer onto the first device layer to the determined sacrificial layer thickness.

In embodiments wherein an etch stop layer 3, or any other material layers are provided between the first device layer 2 and the sacrificial layer 4, the etch removal time for those layers must be taken into consideration when determining the thickness of the sacrificial layer 4, as they will be etch removed as well. In the embodiment of FIG. 1, the etch time of the sacrificial layer 4 provided on the exposed portion of the first device layer 2 must be less to accommodate for the etch time of the etch stop layer 3.

Without the benefit of the patterned sacrificial layer 24 providing an etch rate protraction mechanism, the exposed first portion 31 would be removed to the common layer 1 before the removal of the exposed second portion 33. As the etch process is continued, in order to remove the remaining exposed second portion 33 to the common layer 1, the exposed portion of the common layer 1 adjacent the first device stack 35 would be etched potentially there through providing an undesirable result.

Figure 6A:
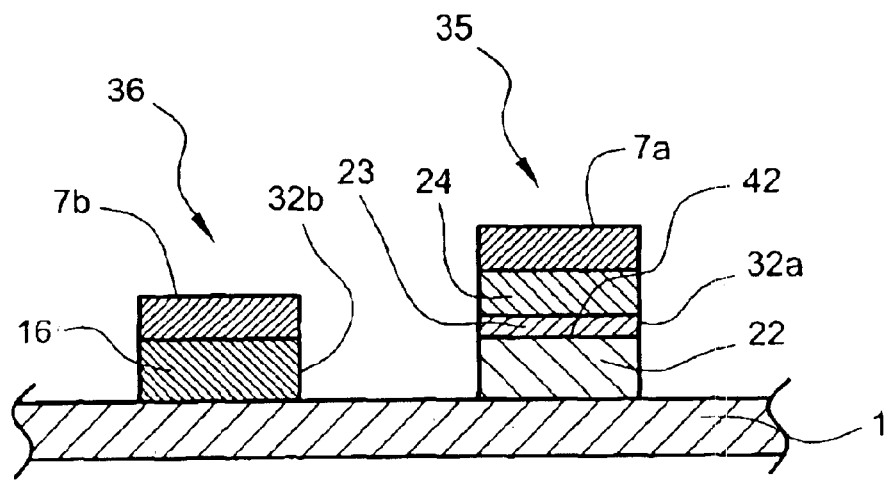
FIGS. 6A and 6B are cross-sectional views showing a common layer of the embodiment of FIG. 5 after an appropriate etch process, in accordance with an embodiment of the method of the present invention.
Figure 6B:
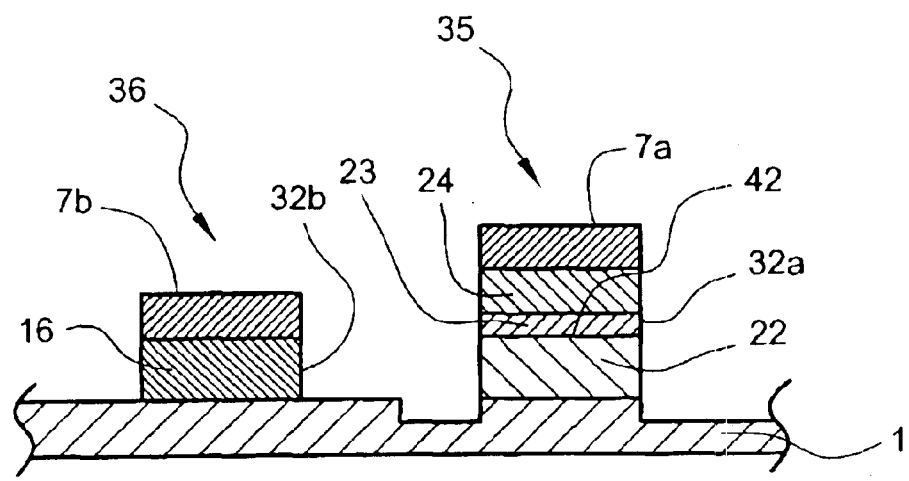

FIGS. 6A and 6B are cross-sectional views of the embodiment of FIG. 5 showing the common layer 1 after an appropriate etch process. The etch process removes the first and second exposed portions 31,33 to the common layer (FIG. 6A, or within the common layer 1 (FIG. 6B), defining a first device stack 35 and a second device stack 36. The first device stack 35 comprises the first hard mask 7a, a device-sized sacrificial layer 24, a device-sized etch stop layer 23, and a first device 22. The second device stack 36 comprises the second hard mask 7b and a second device 16. The first and second device stacks 35,36 extend from the same common layer 1.

An appropriate etch process identified above depends on the material composition of the layers to be etched. For example, one etch process includes, but is not limited to, a plasma etch process, also known as dry etch. A suitable plasma etch process includes, but is not limited to, the well-known CH4+H2+O2 system. Plasma etch is particularly useful for the selective etch of only those material layers not in the shadow of the first and second hard masks 7a,7b. The result provides finely defined device structures having well defined device side walls 32 that are substantially coplanar with the perimeter of the first and second hard masks 7a,7b.

Another process is known as a wet etch process. The wet etch process involves the use of chemical etch fluids that are applied to the target surface. For example, wherein the patterned first semiconductor layer 12 and/or second semiconductor layer 6 comprises a compound semiconductor, such as, but not limited to one or more layers of InP and InGaAsP, an appropriate wet etch chemical solution includes, but is not limited to, saturated brom-water and other brom-based etchants. In this example, the brom-based etchants will not be as selective as other etch processes having the potential to etch multiple material layers within the device layer, but can be made to have some degree of selectivity to adjust the etch rate of specific material layers. Wet etch processes can produce very precise control over the resulting geometry. For example, HCL is a good etchant for InP, but does not significantly etch InGaAsP.

The embodiments as shown in FIGS. 6A,6B provide a point of departure for further processing for the fabrication of many different configurations of integrated semiconductor components. In embodiments of methods of the present invention, among others, the first and second devices 22,16 are exposed and further processed. In other embodiments, among others, additional processing is performed prior to the removal of the first and second hard masks 7a,7b. The common layer 1 presents a substantially planar surface between the first and second device stacks 35,36 which can be used to advantage in further processing.

Figure 7:
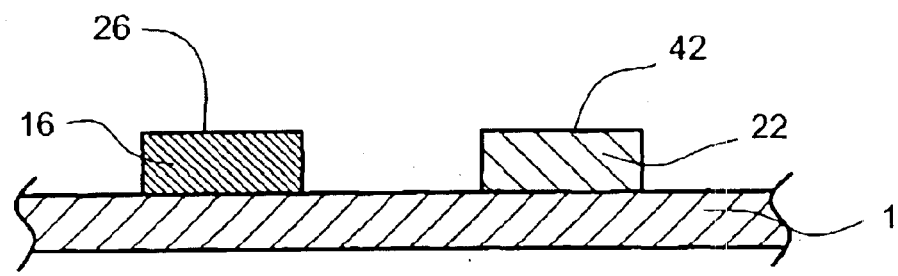
FIG. 7 is a cross-sectional view of the embodiment of FIG. 6 after an etch process was used for the removal of the first hard mask, in accordance with an embodiment of the method of the present invention.

FIG. 7 is a cross-sectional view of the embodiment of FIG. 6A after an etch process was used for the removal of the first hard mask 17a, the device-sized sacrificial layer 24, and the device-sized etch stop layer 23 which exposes the first device 22, and the removal of the second hard mask 17b which exposes the second device 16. Suitable etch processes, by way of example and not limited thereto, wherein the hard mask layer comprises SiO2, includes a wet etch process using buffered hydrofluoric acid (BHF) and a plasma etch process using C2F6+CHF3+O2. The etch process may involve different etch chemistries suitable for each material layer.

Figure 8:
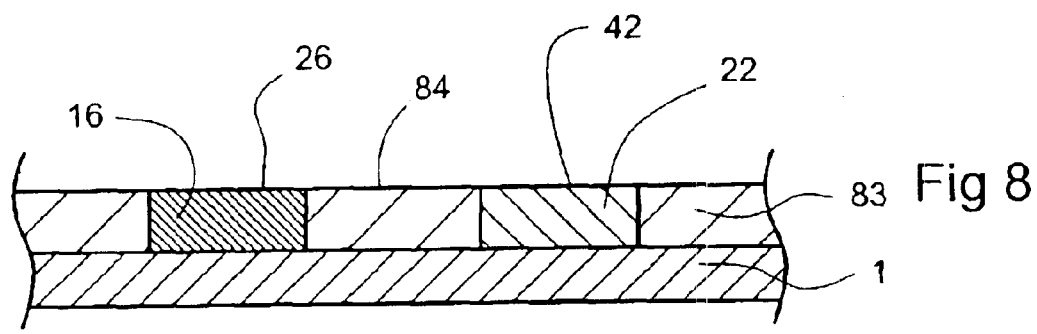
FIG. 8 is a cross-sectional view of the embodiment of FIG. 7 after a passivation and planarization process, in accordance with an embodiment of the present invention.

FIG. 8 is a cross-sectional view of the embodiment of FIG. 7 after a passivation and planarization process, in accordance with an embodiment of the present invention. A passivation layer 83 is applied to the common layer 1 to encapsulate the first and second devices 22,16. The passivation layer 83 is planarized with a first device surface 42 and a second device surface 26 forming a planarized surface 84. The passivation layer 83 protects the sides of the first and second devices 22,16 from oxidation and contamination, among others. Further processing may be performed, such as, but not limited to, metallizing the planarized surface 84 to interconnect the first and second devices 22,16 and/or with other devices on the common layer 1.

Figure 9:
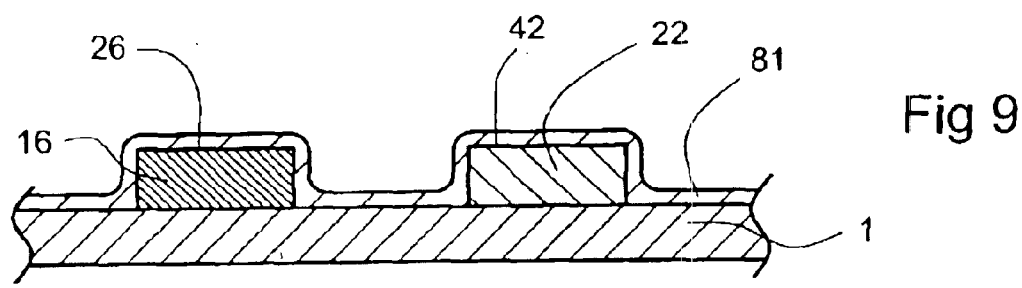
FIG. 9 is a cross-sectional view of the embodiment of FIG. 7 after a deposition of a conformal passivation layer is applied to the common layer and first and second devices, in accordance with an embodiment of the method of the present invention.

FIG. 9 is a cross-sectional view of the embodiment of FIG. 7 after a deposition of a conformal passivation layer 81 is applied to the common layer 1 and the first and second devices 42,26, in another embodiment in accordance with the present invention. The conformal passivation layer 81 is a thin layer in intimate contact with the surfaces upon which it is deposited that, among other things, prevents oxidation of the first and second devices 42,26 and/or is a dielectric layer for improved inter- and intra-layer electrical isolation. The conformal passivation layer 81 can be any suitable material having predetermined etch characteristics, applied using any suitable process. In one embodiment, a suitable material is chemical vapor deposited Si3N4. Since the first and second side-walls 32a,32b may have a substantially vertical orientation, the application process must be one that can substantially uniformly deposit material on vertical surfaces, such as, but not limited to, a tilted metal evaporation process.

Figure 10:
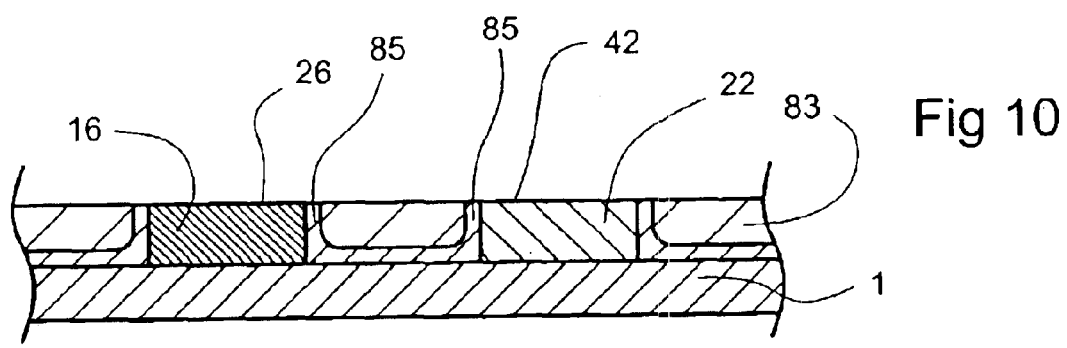
FIG. 10 is a cross-sectional view of the embodiment of FIG. 9 after a passivation and planarization process, in accordance with an embodiment of the method of the present invention.

FIG. 10 is a cross-sectional view of the embodiment of FIG. 9 after a passivation and planarization process, in accordance with an embodiment of the present invention, and substantially similar to the process represented in FIGS. 7–8. After the planarization process, the conformal passivation layer 81 provides the first and second devices 42,26 with a passivation liner 85.

Figure 11:
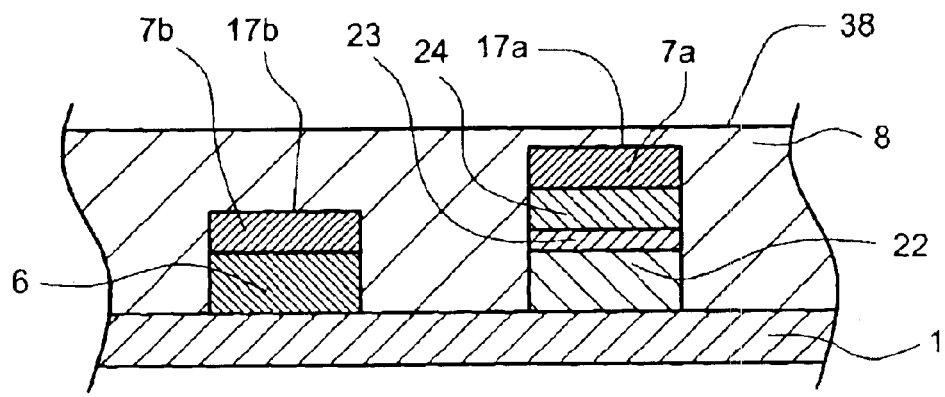
FIG. 11 is a cross-sectional view of the embodiment of FIG. 6A showing a passivation layer applied to the common layer and encasing the first and second device stacks, in accordance with an embodiment of the method of the present invention.

FIG. 11 is a cross-sectional view of the embodiment of FIG. 6A showing a passivation layer 8 applied to the common layer 1 and encasing the first and second device stacks 36,36. The passivation layer 8 is applied to conform to the side walls 32a,32b in order to passivate them. An applied passivation layer surface 38 extends to a predetermined elevation above the common layer 1 that is at least flush with or at a greater elevation to the hard mask surface 17a that represents the hard mask surface that is at the highest elevation above the common layer 1. The passivation layer 8 is preselected from materials with appropriate electrical properties and etch characteristics. A suitable material for the passivation layer 8 includes, but is not limited to, Bisbenzocyclotene (BCB) polymer. In one application technique, among others, the encasing passivation layer is spun onto the common layer 1 to conform to the first and second device stacks 36, 36.

Figure 12:
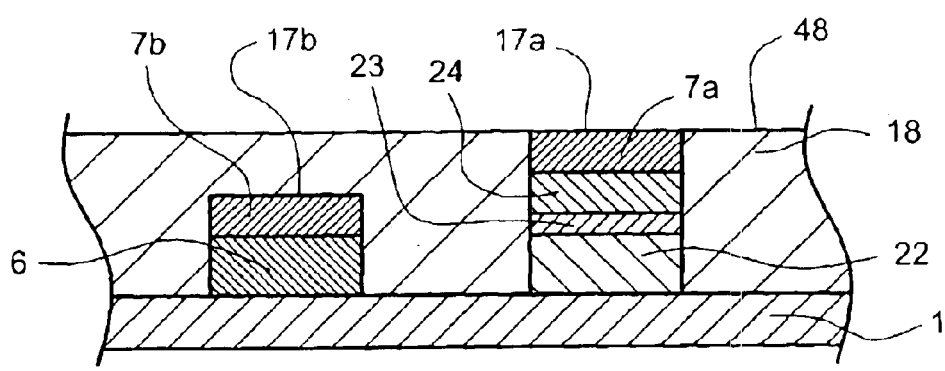
FIG. 12 is a cross-sectional view of the embodiment of FIG. 11 after an etch process to lower the elevation of the passivation layer surface, in accordance with an embodiment of the method of the present invention.

FIG. 12 is a cross-sectional view of the embodiment of FIG. 11 showing a passivation layer 18 either as applied, or after a suitable etch process that lowers the elevation of the passivation layer surface 38. A suitable etch process includes, but is not limited to, the plasma etch process. The etch process produces a passivation layer surface 48 that is at an elevation that is substantially flush with and providing exposure of the first hard mask surface 17a.

Figure 13:
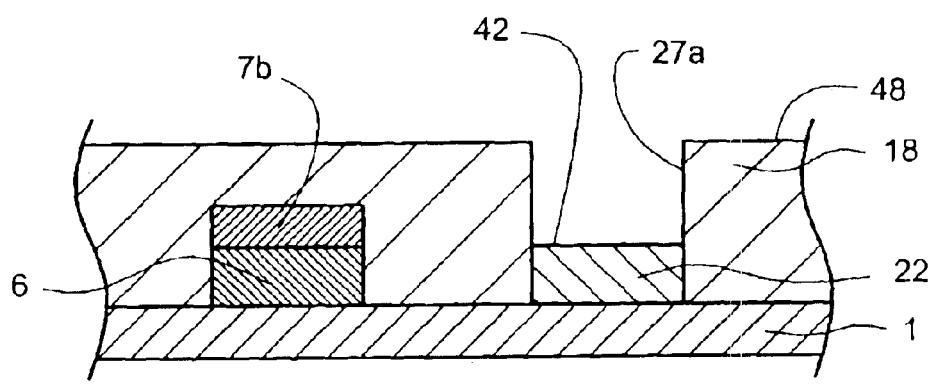
FIG. 13 is a cross-sectional view of the embodiment of FIG. 12 after an etch process used for the removal of the first hard mask, in accordance with an embodiment of the method of the present invention.

FIG. 13 is a cross-sectional view of the embodiment of FIG. 12 after an etch process for the removal of the first hard mask 17a, the device-sized sacrificial layer 24, and the device-sized etch stop layer 23 which exposes a first device surface 42 of the first device 22, forming a first device cavity 27a. Suitable etch processes, by way of example and not limited thereto, wherein the hard mask layer comprises SiO2, includes a wet etch process using buffered hydrofluoric acid (BHF) and a plasma etch process using C2F6+CHF3+O2. The etch process may involve different chemical etchants suitable for each material layer.

Again, it is appreciated that the device-sized etch stop layer 23 is provided to prevent etching of the first device 22 as the device-sized sacrificial layer 24 is etch removed. The device-sized etch stop layer 23 is removed with an etch solution that is not significantly harmful to the first device 22.

In other embodiments in accordance with the methods of the present invention, a device-sized etch stop layer 23 is not provided when the first device surface 42 comprises a material resistant to the etch chemistry used to etch the device-sized sacrificial layer 24. It is desired that the first device surface 42 be subjected to little or no etching.

Figure 14:
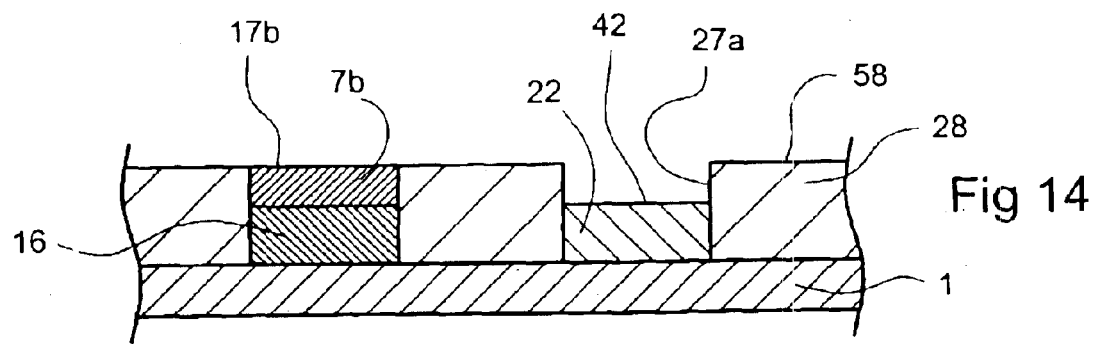
FIG. 14 is a cross-sectional view of the embodiment of FIG. 13 showing a passivation layer after a suitable etch process that lowers the elevation of the passivation layer surface, in accordance with an embodiment of the method of the present invention.

FIG. 14 is a cross-sectional view of the embodiment of FIG. 13 showing a passivation layer 28 after a suitable etch process that lowers the elevation of the passivation layer surface 48. The etch process produces a passivation layer surface 58 that is at an elevation substantially flush with and exposing the second hard mask surface 17b representing the hard mask surface that is at the next highest elevation.

Figure 15:
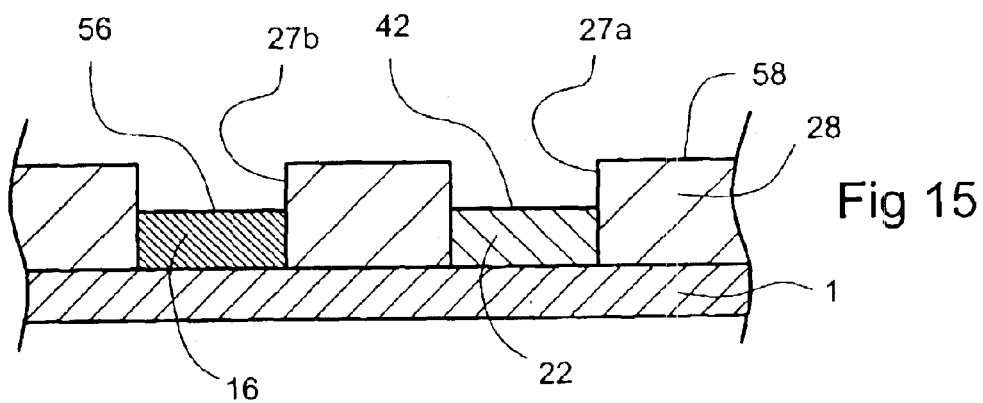
FIG. 15 is a cross-sectional view of the embodiment of FIG. 14 after the removal of the second hard mask, in accordance with an embodiment of the method of the present invention.

FIG. 15 is a cross-sectional view of the embodiment of FIG. 14 after the removal of the second hard mask 7b which exposes a second device surface 26 of the second device 16. The removal of the second hard mask 7b is done in substantially the same way as for the removal of the first hard mast 7a. The removal of the second hard mask 7b forms a second device cavity 27b.

The elevation of the first and second device surfaces 42,26 are substantially coplanar as a consequence of the elevation of the second semiconductor layer surface 26 predetermined to be substantially coplanar with the elevation of the patterned first semiconductor layer surface 42, as shown in FIG. 4. It can be appreciated that the elevation above the common layer 1 of the first and second device surfaces 42,26 is dependent on the elevation of the first device layer 2, as shown in FIG. 1.

Referring again to FIG. 15, methods in accordance with the present invention provide a first device cavity 27a and a second device cavity 27b. First and second device cavities 27a,27b provide a high resolution via extending from the first and second device surface 42,26 to the passivation layer surface 58. The first and second device cavities 27a,27b are defined by the material layers within acting as a mold upon which to conform to, in contrast to a process comprising an etch process designed to etch the passivation layer 28. Therefore, the first and second device cavities 27a,27b form high resolution vias, in contrast to lower resolution vias provided by direct etching of the layer comprising the via. The highly defined and controllable vias provided by these embodiments, allow for producing vias having larger diameters compared with a less defined and controlled process that requires the vias to be undersized to accommodate for dimensional tolerance.

Figure 16:
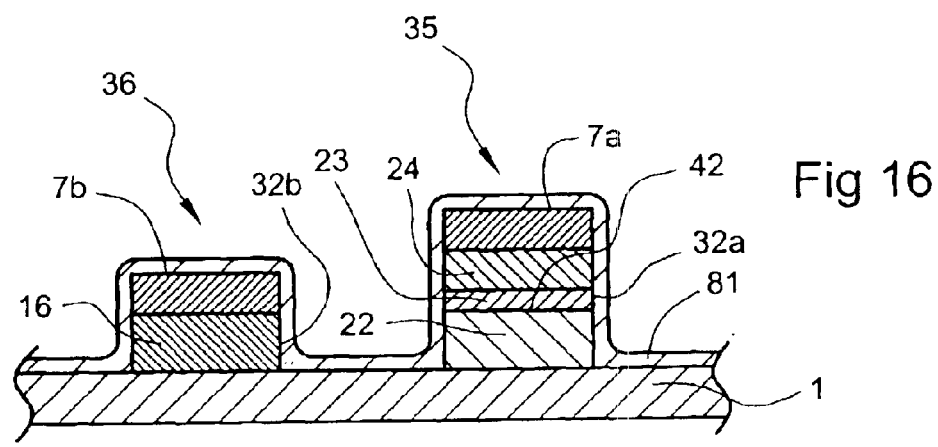
FIG. 16 is a cross-sectional view of the embodiment of FIG. 6A after a deposition of a conformal passivation layer is applied to the common layer and the first and second device stacks, in accordance with an embodiment of the method of the present invention.

FIG. 16 is a cross-sectional view of the embodiment of FIG. 6A after a deposition of a conformal passivation layer 81 is applied to the common layer 1 and the first and second device stacks 35,36, in another embodiment in accordance with the present invention, and as substantially described in the embodiments of FIG. 9. The conformal passivation layer 81 is a thin layer in intimate contact with the surfaces upon which it is deposited that, among other things, prevents oxidation of the first and second devices 42,26 and/or is a dielectric layer for improved inter- and intra-layer electrical isolation. The conformal passivation layer 81 can be any suitable material having predetermined etch characteristics, applied using any suitable process. In this embodiment, the suitable material is resistant to the etch process used to etch remove the hard mask layers 7a,7b, such as, but not limited to, chemical vapor deposition of Si3N4.

Figure 17:
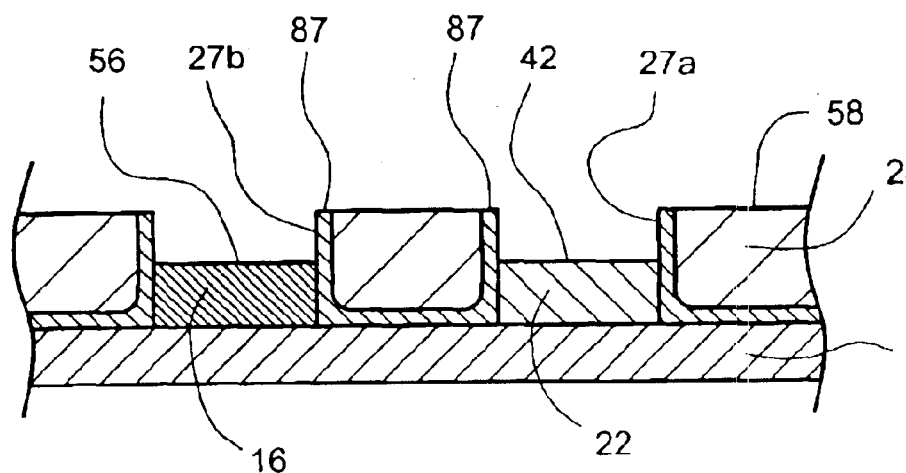
FIG. 17 is a cross-sectional view of the embodiment of FIG. 16 after a process substantially similar to the embodiments as provided in FIGS. 11–15, in accordance with an embodiment of the method of the present invention.

FIG. 17 is a cross-sectional view of the embodiment of FIG. 16 after a process substantially similar to the embodiments as provided in FIGS. 11–15. The resulting first and second device cavities 27a,27b are provided with a passivation liner 85.

Figure 18A:
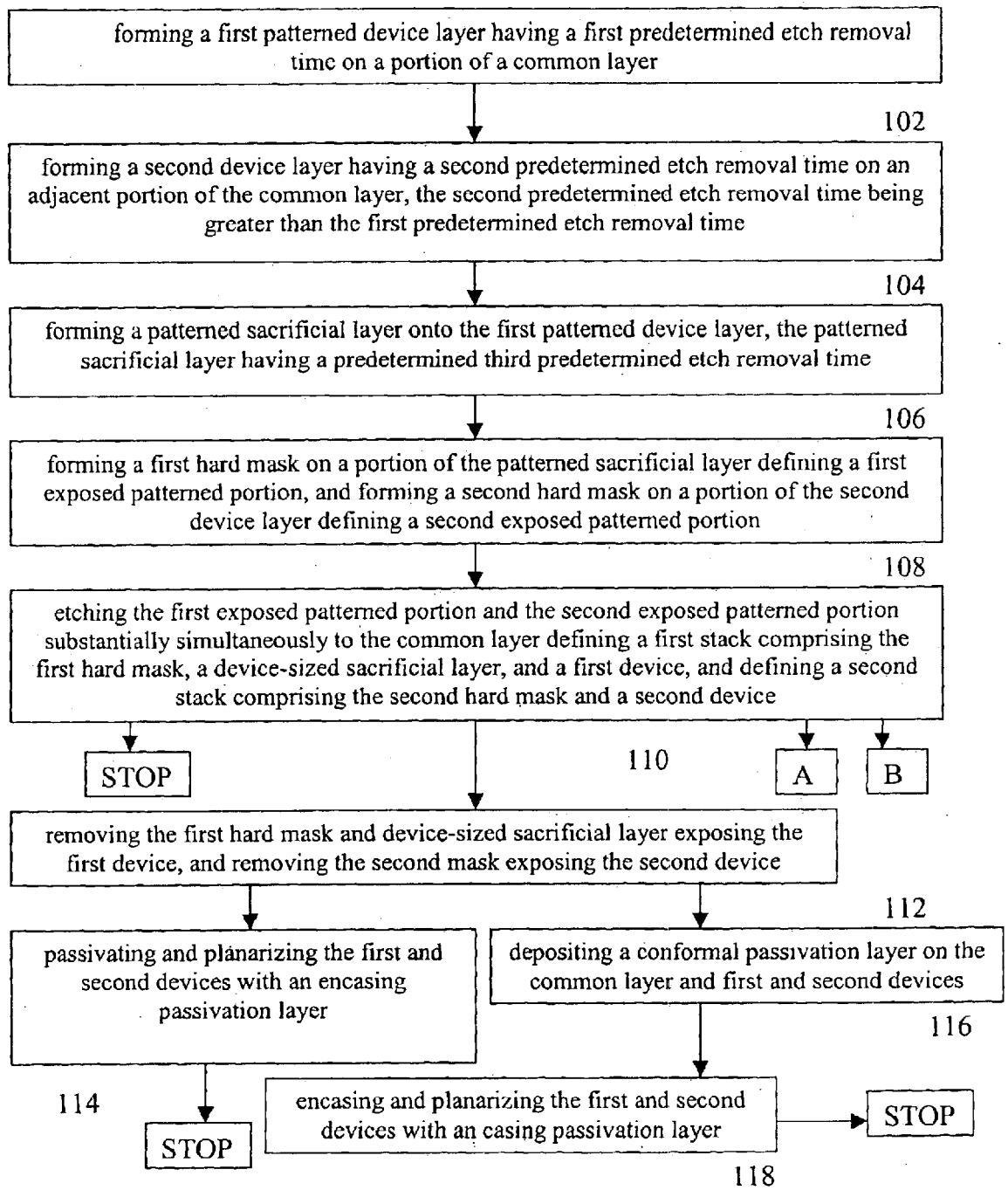
FIGS. 18A and 18B are flow diagrams of embodiments of methods in accordance with the present invention.
Figure 18A:
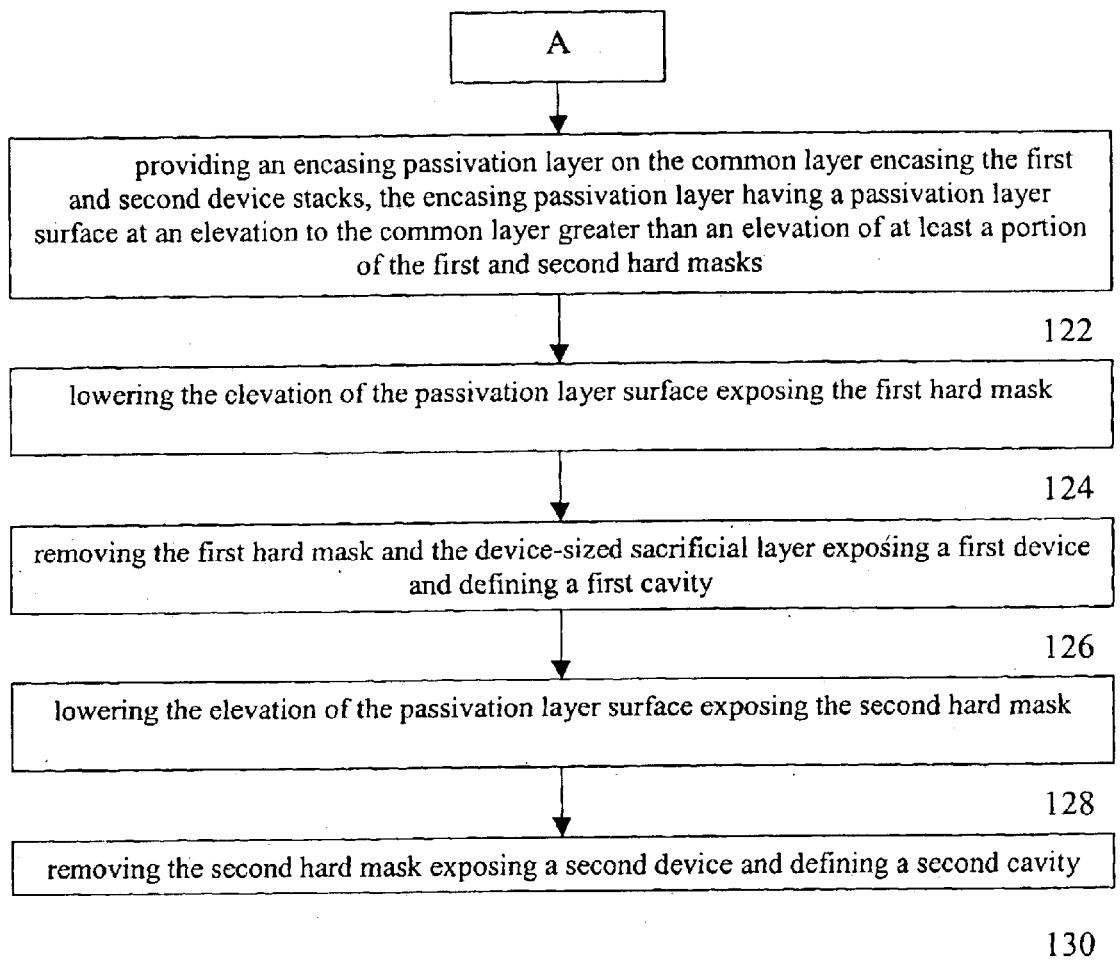
Figure 18A:
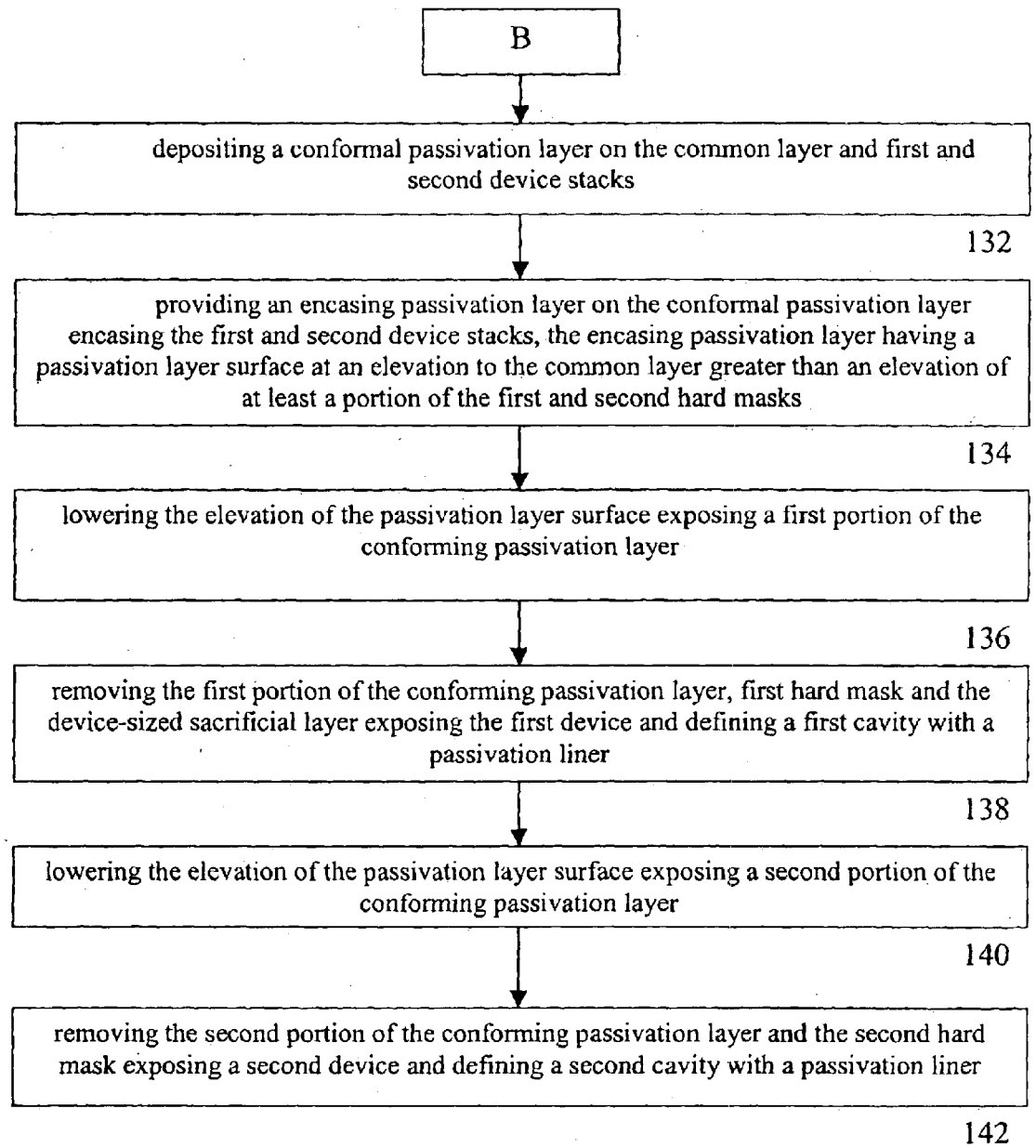

FIG. 18A is a flow diagram of embodiments in accordance with methods of the present invention. One embodiment in accordance with a method of the present invention comprises:

forming a first patterned device layer having a first predetermined etch removal time on a portion of a common layer 102;

forming a second device layer having a second predetermined etch removal time on an adjacent portion of the common layer, the second predetermined etch removal time being greater than the first predetermined etch removal time 104;

forming a patterned sacrificial layer onto the first patterned device layer, the sacrificial layer having a third predetermined etch removal time substantially equal to the difference between the second and the first predetermined etch removal time 106;

forming a first hard mask on a portion of the patterned sacrificial layer defining a first exposed patterned portion, and forming a second hard mask on a portion of the second device layer defining a second exposed patterned portion 108; and etching the first exposed patterned portion and the second exposed patterned portion substantially simultaneously to the common layer defining a first stack comprising the first hard mask, a device-sized sacrificial layer, and a first device, and defining a second stack comprising the second hard mask and a second device 110.

Another embodiment in accordance with a method of the present invention comprises essentially the same methods as provided in 102, 104, 106, 108 and 110, further comprising:

removing the first hard mask and device-sized sacrificial layer exposing the first device, and removing the second mask exposing the second device 112; and passivating and planarizing the first and second devices with an encasing passivation layer 114.

Another embodiment in accordance with a method of the present invention comprises essentially the same methods as provided in 102, 104, 106, 108, 110 and 112, further comprising:

depositing a conformal passivation layer on the common layer and first and second devices 116; and encasing and planarizing the first and second devices with an encasing passivation layer 118.

Another embodiment in accordance with a method of the present invention comprises essentially the same methods as provided in 102, 104, 106, 108 and 110 above, further comprising:

providing an encasing passivation layer on the common layer encasing the first and second device stacks, the encasing passivation layer having a passivation layer surface at an elevation to the common layer greater than an elevation of at least a portion of the first and second hard masks 122;

lowering the elevation of the passivation layer surface exposing the first hard mask 124;

removing the first hard mask and the device-sized sacrificial layer exposing the first device and defining a first cavity 126;

lowering the elevation of the passivation layer surface to expose the second hard mask 128; and removing the second hard mask exposing a second device and defining a second cavity 130.

Another embodiment in accordance with a method of the present invention comprises essentially the same methods as provided in 102, 104, 106, 108 and 110 above, further comprising:

depositing a conformal passivation layer on the common layer and first and second device stacks 132;

providing an encasing passivation layer on the conformal passivation layer encasing the first and second device stacks, the encasing passivation layer having a passivation layer surface at an elevation to the common layer greater than an elevation of at least a portion of the first and second hard masks 134;

lowering the elevation of the passivation layer surface exposing a first portion of the conforming passivation layer 136;

removing the first portion of the conforming passivation layer, first hard mask and the device-sized sacrificial layer exposing the first device and defining a first cavity with a passivation liner 138;

lowering the elevation of the passivation layer surface to exposing a second portion of the conforming passivation layer 140; and removing the second portion of the conforming passivation layer and the second hard mask exposing a second device and defining a second cavity with a passivation liner 142.

Figure 18B:
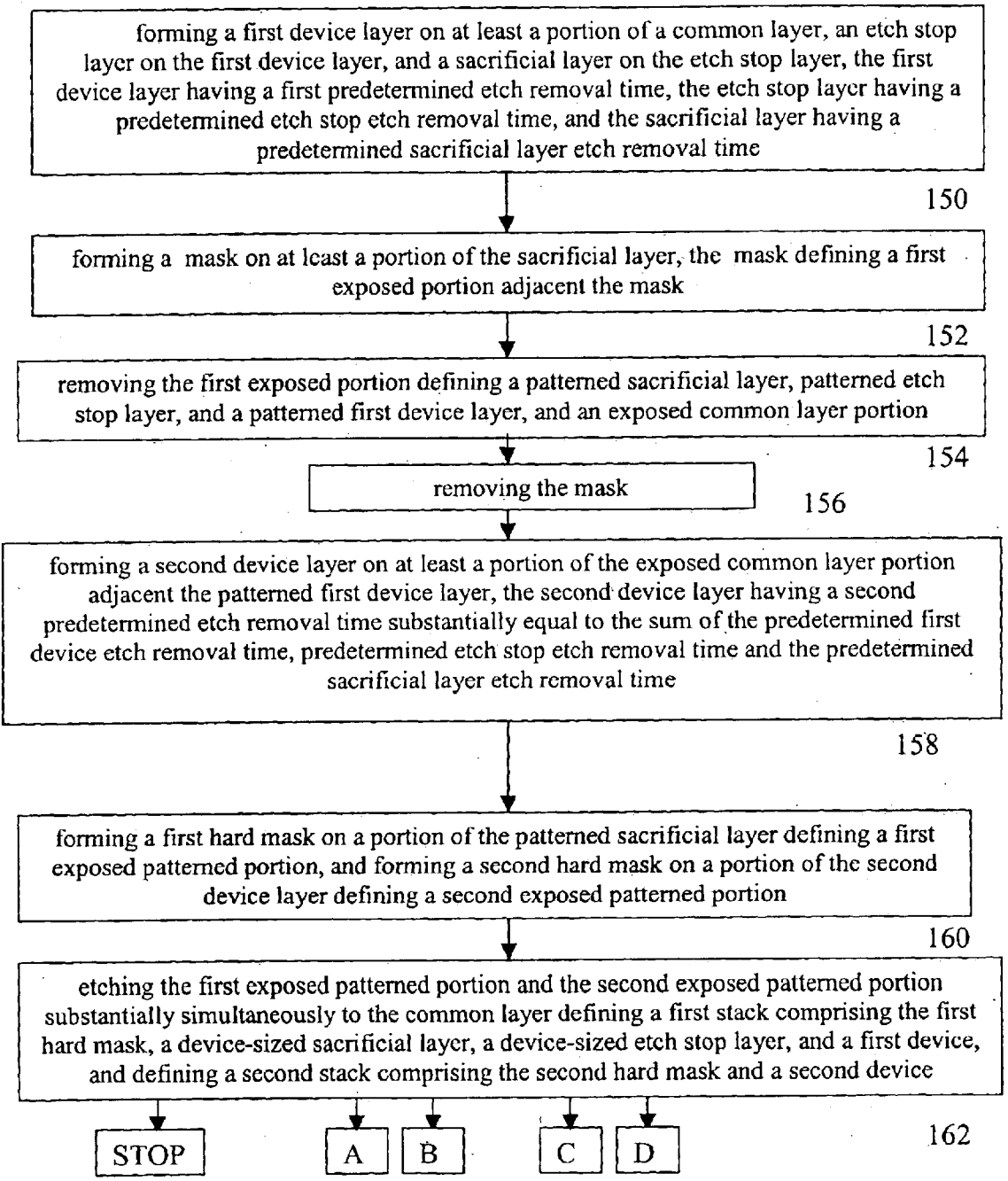
Figure 18B:
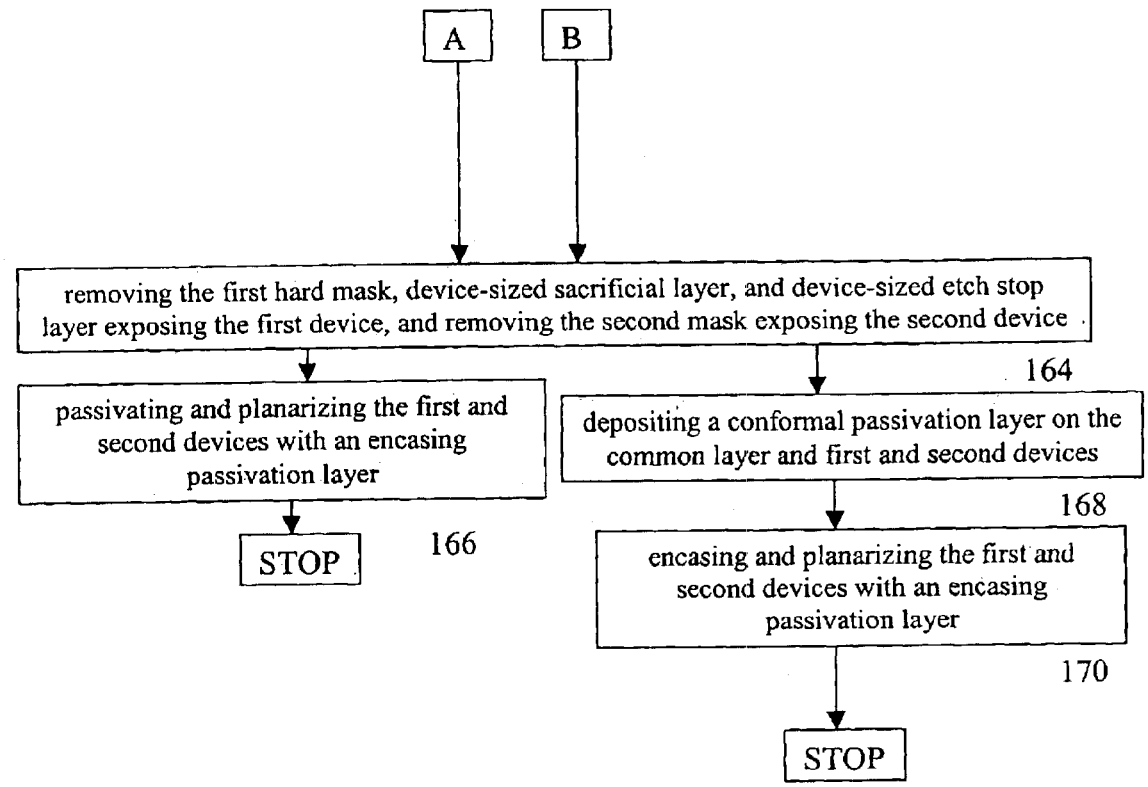
Figure 18B:
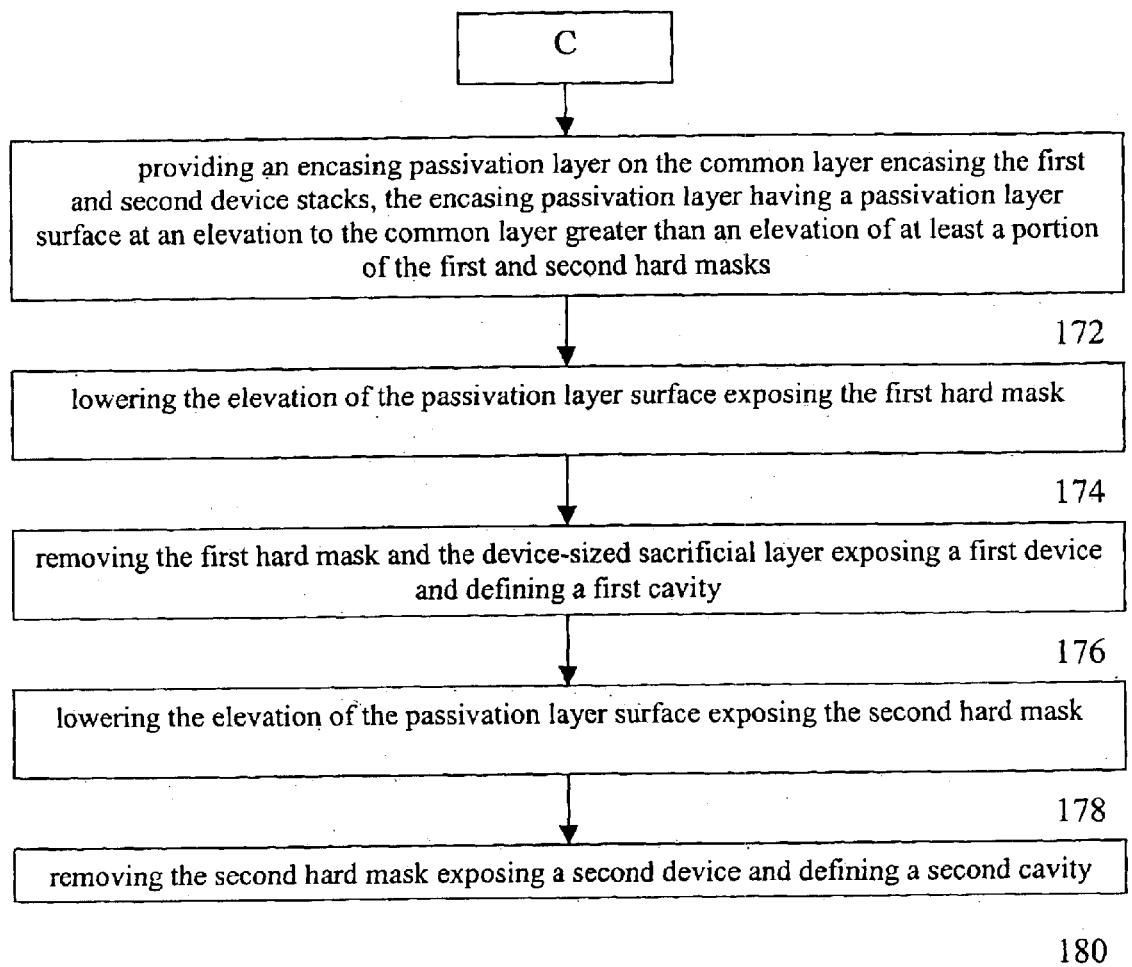
Figure 18B:
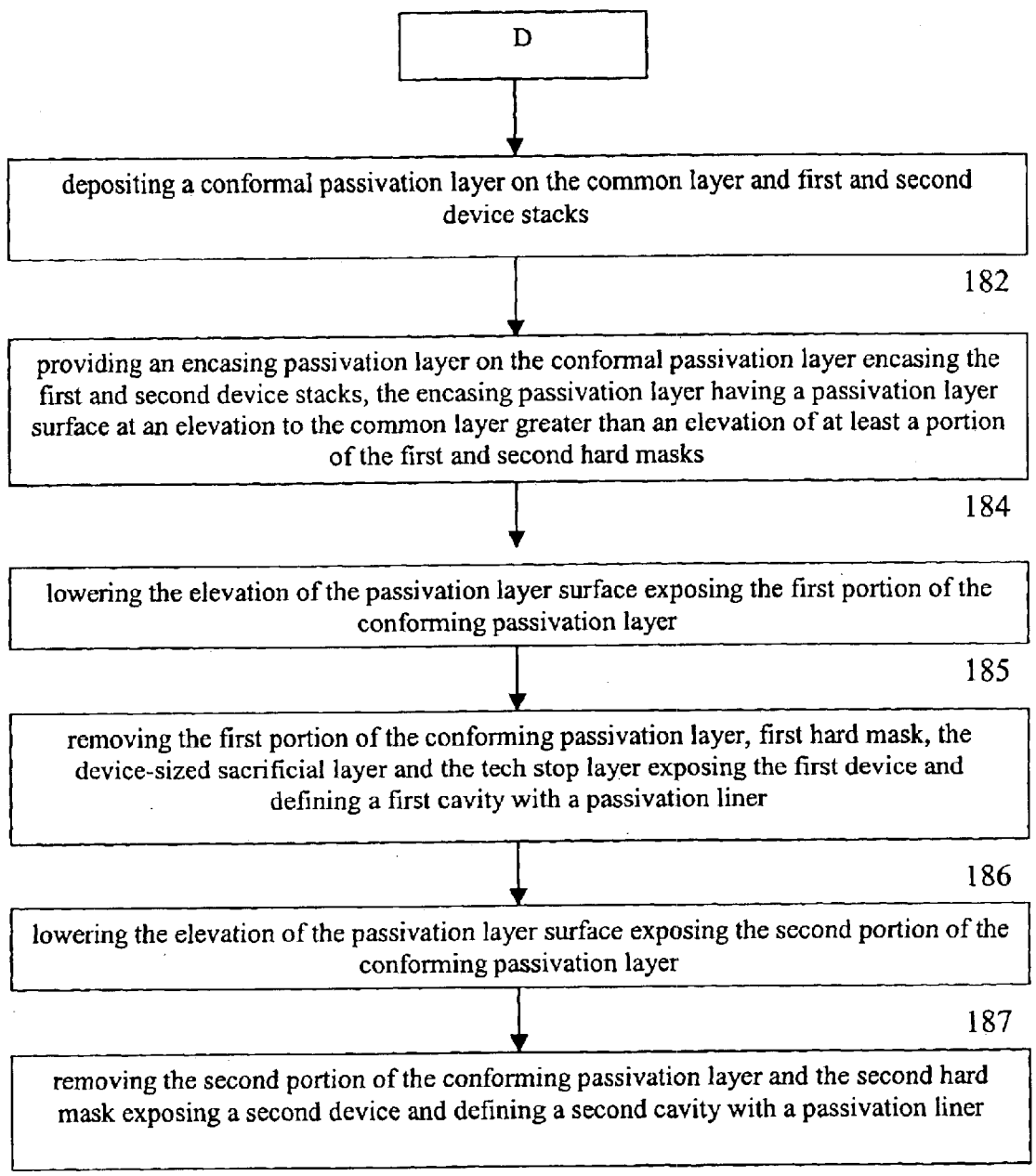
Figure 20A:
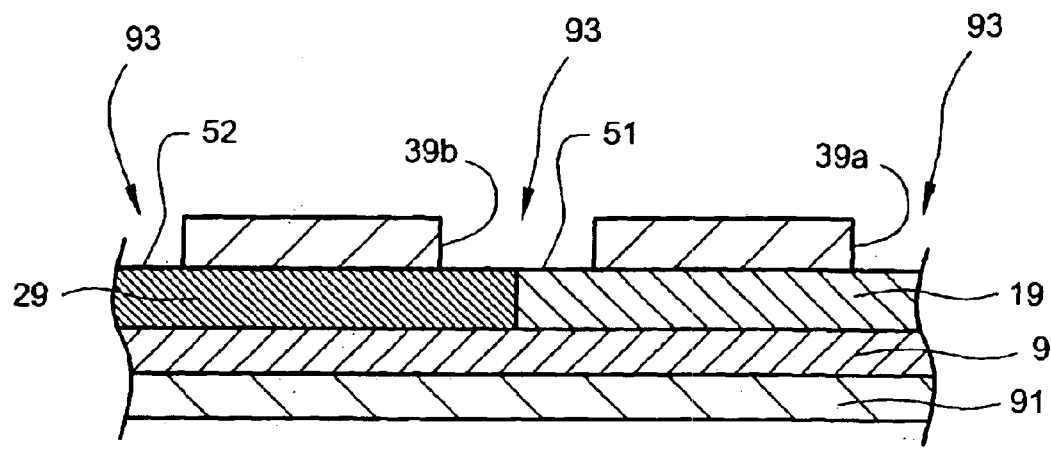
FIGS. 20A, 20B and 20C are cross-sectional views showing the progression of a process to etch multiple dissimilar devices.
Figure 20B:
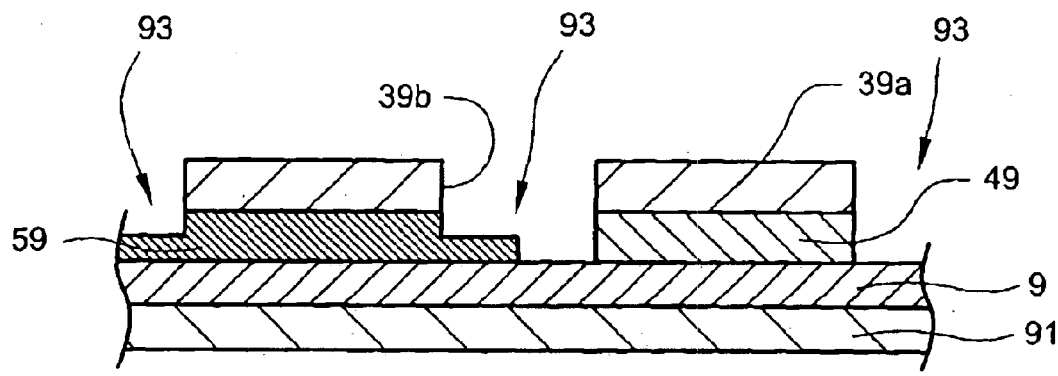
Figure 20C:
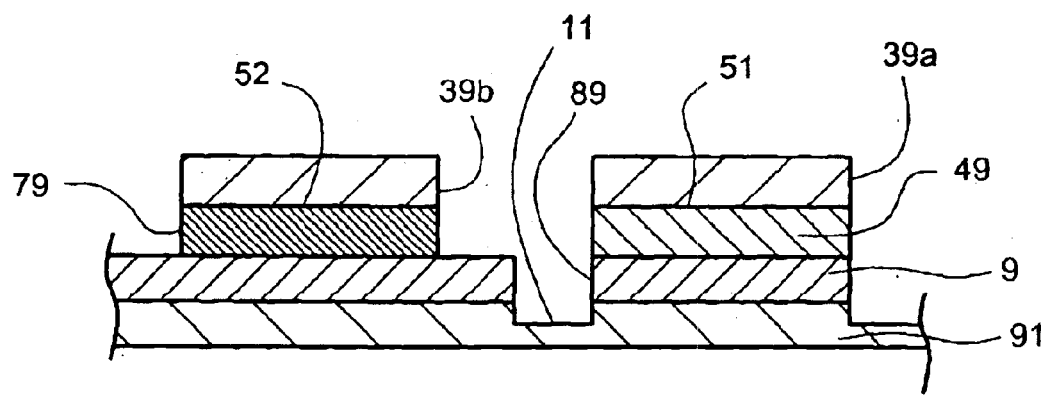

FIG. 18B is a flow diagram of embodiments in accordance with methods of the present invention. One embodiment in accordance with a method of the present invention comprises:

forming a first device layer on at least a portion of a common layer, an etch stop layer on the first device layer, and a sacrificial layer on the etch stop layer, the first device layer having a first predetermined etch removal time, the etch stop layer having a predetermined etch stop etch removal time, and the sacrificial layer having a predetermined sacrificial layer etch removal time 150;

forming a mask on at least a portion of the sacrificial layer, the mask defining a first exposed portion adjacent the mask 152;

removing the first exposed portion defining a patterned sacrificial layer, patterned etch stop layer, and a patterned first device layer, and an exposed common layer portion 154;

removing the mask 156;

forming a second device layer on at least a portion of the exposed common layer portion adjacent the patterned first device layer, the second device layer having a second predetermined etch removal time substantially equal to the sum of the predetermined first device etch removal time, predetermined etch stop etch removal time and the predetermined sacrificial layer etch removal time 158;

forming a first hard mask on a portion of the patterned sacrificial layer defining a first exposed patterned portion, and forming a second hard mask on a portion of the second device layer defining a second exposed patterned portion 160; and etching the first exposed patterned portion and the second exposed patterned portion substantially simultaneously to the common layer defining a first stack comprising the first hard mask, a device-sized sacrificial layer, a device-sized etch stop layer, and a first device, and defining a second stack comprising the second hard mask and a second device 162.

Another embodiment in accordance with a method of the present invention comprising essentially the same method as provided in 150, 152, 154, 156, 158, 160, and 162, further comprising:

removing the first hard mask, device-sized sacrificial layer, and device-sized etch stop layer exposing the first device, and removing the second mask exposing the second device 164; and passivating and planarizing the first and second devices with an encasing passivation layer 166.

Another embodiment in accordance with a method of the present invention comprising essentially the same method as provided in 150, 152, 154, 156, 158, 160, 162, and 164, further comprising:

depositing a conformal passivation layer on the common layer and first and second devices 168; and encasing and planarizing the first and second devices with an encasing passivation layer 170.

Another embodiment in accordance with a method of the present invention comprising essentially the same method as provided in 150, 152, 154, 156, 158, 160 and 162 above, further comprising:

providing an encasing passivation layer on the common layer encasing the first and second device stacks, the encasing passivation layer having a passivation layer surface at an elevation to the common layer greater than an elevation of at least a portion of the first and second hard masks 172;

lowering the elevation of the passivation layer surface exposing the first hard mask 174;

removing the first hard mask, the device-sized sacrificial layer, and the device-sized etch stop layer exposing the first device and defining a first cavity 176;

lowering the elevation of the passivation layer surface to expose the second hard mask 178; and removing the second hard mask exposing a second device and defining a second cavity 180.

Another embodiment in accordance with a method of the present invention comprising essentially the same method as provided in 150, 152, 154, 156, 158, 160 and 162 above, further comprising:

depositing a conformal passivation layer on the common layer and first and second device stacks 182;

providing an encasing passivation layer on the conformal passivation layer encasing the first and second device stacks, the encasing passivation layer having a passivation layer surface at an elevation to the common layer greater than an elevation of at least a portion of the first and second hard masks 184;

lowering the elevation of the passivation layer surface exposing a first portion of the conforming passivation layer 186;

removing the first portion of the conforming passivation layer, first hard mask, the device-sized sacrificial layer and the tech stop layer exposing the first device and defining a first cavity with a passivation liner 188;

lowering the elevation of the passivation layer surface to exposing a second portion of the conforming passivation layer 190; and removing the second portion of the conforming passivation layer and the second hard mask exposing a second device and defining a second cavity with a passivation liner 192.

Figure 19:
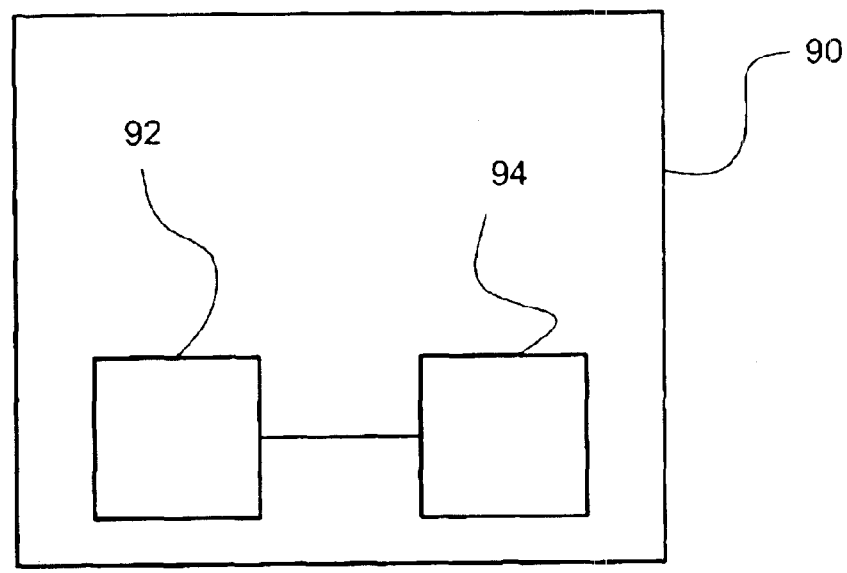
FIG. 19 is a top view of an assembly comprising a plurality of interconnected components wherein at least one component comprises an integrated semiconductor component comprising a device fabricated in accordance with an embodiment of the methods of the present invention.

FIG. 19 is a top view of an assembly 90 comprising a plurality of interconnected components 92, 94 wherein at least one component 92 comprises an integrated semiconductor component comprising a device fabricated in accordance with an embodiment of the methods of the present invention. The integrated semiconductor component is tested, separated, packaged, incorporated into the component 92, and integrated into the assembly 90. Examples of assemblies 90 include, but not limited to, cell phones, networking systems, high brightness (HB) light emitting diodes (LEDs), laser diodes (LDs), photodiodes, modulator diodes, and multijunction solar cells.

Methods in accordance with the present invention can be used to fabricate many types of devices, such as, but not limited to, heterobiopolar transistors (HBT) and high electron mobility transistors (HEMT) that are prevalent in cordless portable telephones, cell phones, as well as other communication devices.

Methods in accordance with the present invention can be used to fabricate devices based on a variety of semiconducting materials suitable for many applications. For example, but not limited thereto, Indium Phosphide (InP)-based devices are desirable for communication networks as InP devices have the ability to provide functional reliably and high speed operation useful for broadband fiberoptic and wireless components.

Gallium Nitride-based devices are desirable for HB-LEDs and laser diodes in the blue spectrum, as well as memory devices due to GaN's ability to compactly store data and information. Gallium Arsenide Monolithic Microwave Integrated Circuit (GaAs MMIC)-based devices have the ability to deliver a wide range of wavelengths, such as those associated with television satellite transmissions transmitted anywhere on earth that has a satellite dish with MMIC devices.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for fabricating a semiconductor component, comprising:

forming a first patterned device layer having a first predetermined etch removal time on a portion of a common layer;

forming a second device layer having a second predetermined etch removal time on an adjacent portion of the common layer, the second predetermined etch removal time being greater than the first predetermined etch removal time;

forming a patterned sacrificial layer onto the first patterned device layer, the sacrificial layer having a third predetermined etch removal time;

forming a first hard mask on a portion of the patterned sacrificial layer defining a first exposed patterned portion, and forming a second hard mask on a portion of the second device layer defining a second exposed patterned portion; and etching the first exposed patterned portion and the second exposed patterned portion substantially simultaneously to the common layer defining a first stack comprising the first hard mask, a device-sized sacrificial layer, and a first device, and defining a second stack comprising the second hard mask and a second device.

2. The method of claim 1, further comprising:

predetermining the first predetermined etch removal time by calculating the ratio of a first device layer thickness and a first device layer etch rate, and predetermining the second predetermined etch removal time by calculating the ratio of a second device layer thickness and a second device layer etch rate, calculating an etch removal time differential by subtracting the first from the second etch removal times, and wherein forming a sacrificial layer onto the first device layer comprises determining a sacrificial layer thickness as the product of the etch removal time differential and a sacrificial layer etch rate, and forming the sacrificial layer onto the first device layer to the sacrificial layer thickness.

3. The method of claim 1, further comprising:

removing the first hard mask and device-sized sacrificial layer exposing the first device, and removing the second mask exposing the second device; and passivating and planarizing the first and second devices with an encasing passivation layer.

4. The method of claim 1, further comprising;

removing the first hard mask and device-sized sacrificial layer exposing the first device, and removing the second mask exposing the second device;

depositing a conformal passivation layer on the common layer and first and second devices; and encasing and planarizing the first and second devices with an encasing passivation layer.

5. The method of claim 1 further comprising:

providing an encasing passivation layer on the common layer encasing the first and second device stacks, the encasing passivation layer having a passivation layer surface at an elevation to the common layer greater than an elevation of at least a portion of the first and second hard masks;

lowering the elevation of the passivation layer surface exposing the first hard mask;

removing the first hard mask and the device-sized sacrificial layer exposing the first device and defining a first cavity;

lowering the elevation of the passivation layer surface to expose the second hard mask; and removing the second hard mask exposing a second device and defining a second cavity.

6. The method of claim 1, wherein forming a sacrificial layer onto the first device layer comprises:

depositing a conformal passivation layer on the common layer and first and second device stacks;

providing an encasing passivation layer on the conformal passivation layer encasing the first and second device stacks, the encasing passivation layer having a passivation layer surface at an elevation to the common layer greater than an elevation of at least a portion of the first and second hard masks;

lowering the elevation of the passivation layer surface exposing a first portion of the conforming passivation layer;

removing the first portion of the conforming passivation layer, first hard mask and the device-sized sacrificial layer exposing the first device and defining a first cavity with a passivation liner;

lowering the elevation of the passivation layer surface to exposing a second portion of the conforming-passivation layer; and removing the second portion of the conforming passivation layer and the second hard mask exposing a second device and defining a second cavity with a passivation liner.

7. The method of claim 1, wherein forming a patterned sacrificial layer onto the first patterned device layer, the sacrificial layer having a third predetermined etch removal time comprises forming a patterned etch stop layer onto the first patterned device layer and forming a patterned sacrificial layer onto the patterned. etch stop layer, the sacrificial layer and the etch stop layer having a combined third predetermined etch removal time.

8. The method of claim 1, wherein etching the first and second exposed patterned portion comprises:

etching the first and second exposed patterned portion using a wet etch process.

9. The method of claim 5, wherein lowering the elevation of the passivation layer surface comprises:

etching the encasing passivation layer using a dry etch process layer.

10. The method of claim 1, wherein forming a first and second hard mask comprises forming a first and second hard mask comprising a material selected from the group consisting of silicon dioxide, silicon nitride, and metal.

11. A method for fabricating microelectronic components, comprising:

forming a first device layer on at least a portion of a common layer, an etch stop layer on the first device layer, and a sacrificial layer on the etch stop layer, the first device layer having a first predetermined etch removal time, the etch stop layer having a predetermined etch stop etch removal time, and the sacrificial layer having a predetermined sacrificial layer etch removal time;

forming a mask on at least a portion of the sacrificial layer, the mask defining a first exposed portion adjacent the mask;

removing the first exposed portion defining a patterned sacrificial layer, patterned etch stop layer, and a patterned first device layer, and an exposed common layer portion;

removing the mask;

forming a second device layer on at least a portion of the exposed common layer portion adjacent the patterned first device layer, the second device layer having a second predetermined etch removal time substantially equal to the sum of the predetermined first device etch removal time, predetermined etch stop etch removal time and the predetermined sacrificial layer etch removal time;

forming a first hard mask on a portion of the patterned sacrificial layer defining a first exposed patterned portion, and forming a second hard mask on a portion of the second device layer defining a second exposed patterned portion; and etching the first exposed patterned portion and the second exposed patterned portion substantially simultaneously to the common layer defining a first stack comprising the first hard mask, a device-sized sacrificial layer, a device-sized etch stop layer, and a first device, and defining a second stack comprising the second hard mask and a second device.

12. The method of claim 11, further comprising:

predetermining the first predetermined etch removal time by calculating the ratio of a first device layer thickness and a first device layer etch rate, and predetermining the second predetermined etch removal time by calculating the ratio of a second device layer thickness and a second device layer etch rate, calculating an etch removal time differential by subtracting the first from the second etch removal times, and wherein forming a sacrificial layer onto the first device layer comprises determining a sacrificial layer thickness as the product of the etch removal time differential and a sacrificial layer etch rate, and forming the sacrificial layer onto the first device layer to the sacrificial layer thickness.

13. The method of claim 11 further comprising;

removing the first hard mask, device-sized sacrificial layer, and device-sized etch stop layer exposing the first device, and removing the second mask exposing the second device; and passivating and planarizing the first and second devices with an encasing passivation layer.

14. The method of claim 11, further comprising:

removing the first hard mask, device-sized sacrificial layer, and device-sized etch stop layer exposing the first device, and removing the second mask exposing the second device;

depositing a conformal passivation layer on the common layer and first and second devices; and encasing and planarizing the first and second devices with an encasing passivation layer.

15. The method of claim 11, further comprising:

providing an encasing passivation layer on the common layer encasing the first and second device stacks, the encasing passivation layer having a passivation layer surface at an elevation to the common layer greater than an elevation of at least a portion of the first and second hard masks;

lowering the elevation of the passivation layer surface exposing the first hard mask;

removing the first hard mask, the device-sized sacrificial layer, and the device-sized etch stop layer exposing the first device and defining a first cavity;

lowering the elevation of the passivation layer surface to expose the second hard mask; and removing the second hard mask exposing a second device and defining a second cavity.

16. The method of claim 11, further comprising:

depositing a conformal passivation layer on the common layer and first and second device stacks;

providing an encasing passivation layer on the conformal passivation layer encasing the first and second device stacks, the encasing passivation layer having a passivation layer surface at an elevation to the common layer greater than an elevation of at least a portion of the first and second hard masks;

lowering the elevation of the passivation layer surface exposing a first portion of the conforming passivation layer;

removing the first portion of the conforming passivation layer, first hard mask, the device-sized sacrificial layer and the etch stop layer exposing the first device and defining a first cavity with a passivation liner;

lowering the elevation of the passivation layer surface to exposing a second portion of the conforming passivation layer; and removing the second portion of the conforming passivation layer and the second hard mask exposing a second device and defining a second cavity with a passivation liner.

17. The method of claim 11, wherein etching the first and second exposed patterned portion comprises:

etching the first and second exposed patterned portion using a wet etch process.

18. The method of claim 16, wherein lowering the elevation of the passivation layer surface comprises:

etching the passivation layer using a dry etch process layer.

19. The method of claim 11, wherein forming a first and second hard mask layer comprises forming a first and second hard mask layer comprising a material selected from the group consisting of silicon dioxide, silicon nitride, and metal.

20. A method for fabricating an assembly, comprising:

interconnecting a plurality of components wherein at least one comprises a device, the device fabricated using a method comprising:

forming a first patterned device layer having a first predetermined etch removal time on a portion of a common layer, forming a second device layer having a second predetermined etch removal time on an adjacent portion of the common layer, the second predetermined etch removal time being greater than the first predetermined etch removal time;

forming a patterned sacrificial layer onto the first patterned device layer, the sacrificial layer having a third predetermined etch removal time;

forming a first hard mask on a portion of the patterned sacrificial layer defining a first exposed patterned portion, and forming a second hard mask on a portion of the second device layer defining a second exposed patterned portion; and etching the first exposed patterned portion and the second exposed patterned portion substantially simultaneously to the common layer defining a first stack comprising the first hard mask, a device-sized sacrificial layer, and a first device, and defining a second stack comprising the second hard mask and a second device.

21. The method of claim 20, further comprising:

predetermining the first predetermined etch removal time by calculating the ratio of a first device layer thickness and a first device layer etch rate, and predetermining the second predetermined etch removal time by calculating the ratio of a second device layer thickness and a second device layer etch rate, calculating an etch removal time differential by subtracting the first from the second etch removal times, and wherein forming a sacrificial layer onto the first device layer comprises determining a sacrificial layer thickness as the product of the etch removal time differential and a sacrificial layer etch rate, and forming the sacrificial layer onto the first device layer to the sacrificial layer thickness.

22. The method of claim 20, further comprising:

removing the first hard mask and device-sized sacrificial layer exposing the first device, and removing the second mask exposing the second device; and passivating and planarizing the first and second devices with an encasing passivation layer.

23. The method of claim 20 further comprising;

removing the first hard mask and device-sized sacrificial layer exposing the first device, and removing the second mask exposing the second device;

depositing a conformal passivation layer on the common layer and first and second devices; and encasing and planarizing the first and second devices with an encasing passivation layer.

24. The method of claim 20 further comprising:

providing an encasing passivation layer on the common layer encasing the first and second device stacks, the encasing passivation layer having a passivation layer surface at an elevation to the common layer greater than an elevation of at least a portion of the first and second hard masks;

lowering the elevation of the passivation layer surface exposing the first hard mask;

removing the first hard mask and the device-sized sacrificial layer exposing the first device and defining a first cavity;

lowering the elevation of the passivation layer surface to expose the second hard mask; and removing the second hard mask exposing a second device and defining a second cavity.

25. The method of claim 20, wherein forming a sacrificial layer onto the first device layer comprises:

depositing a conformal passivation layer on the common layer and first and second device stacks;

providing an encasing passivation layer on the conformal passivation layer encasing the first and second device stacks, the encasing passivation layer having a passivation layer surface at an elevation to the common layer greater than an elevation of at least a portion of the first and second hard masks;

lowering the elevation of the passivation layer surface exposing a first portion of the conforming passivation layer;

removing the first portion of the conforming passivation layer, first hard mask and the device-sized sacrificial layer exposing the first device and defining a first cavity with a passivation liner;

lowering the elevation of the passivation layer surface to exposing a second portion of the conforming passivation layer, and removing the second portion of the conforming passivation layer and the second hard mask exposing a second device and defining a second cavity with a passivation liner.

26. The method of claim 20, wherein forming a patterned sacrificial layer onto the first patterned device layer, the sacrificial layer having a third predetermined etch removal time comprises forming a patterned etch stop layer onto the first patterned device layer and forming a patterned sacrificial layer onto the patterned etch stop layer, the sacrificial layer and the etch stop layer having a combined third predetermined etch removal time.

27. The method of claim 20, wherein etching the first and second exposed patterned portion comprises:

etching the first and second exposed patterned portion using a wet etch process.

28. The method of claim 24, wherein lowering the elevation of the passivation layer surface comprises:

etching the encasing passivation layer using a dry etch process layer.

29. The method of claim 20, wherein forming a first and second hard mask comprises forming a first and second hard mask comprising a material selected from the group consisting of silicon dioxide, silicon nitride, and metal.

* * * * *

UNITED STATES PATENT AND TRADEMARK OFFICE
CERTIFICATE OF CORRECTION

PATENT NO. : 6,806,204 B1 Page 1 of 1
APPLICATION NO. : 10/611837
DATED : October 19, 2004
INVENTOR(S) : Jun-Fei Zheng and Jesper Hanberg It is certified that error appears in the above-identified patent and that said Letters Patent is hereby corrected as shown below:

Column 16
Lines 9-10, "...conforming-passivation..." should read --...conforming passivation...--.
Line 21, "...patterned. etch..." should read --...patterned etch...--.

Signed and Sealed this

Third Day of April, 2007

JON W. DUDAS
*Director of the United States Patent and Trademark Office*